United States Patent [19]

Bernier

[11] Patent Number: 5,696,391

[45] Date of Patent: Dec. 9, 1997

[54] OVERLOAD PROTECTION CIRCUIT

[75] Inventor: Eric Bernier, Mettray, France

[73] Assignee: SGS-Thomson Microelectronics S.A., Saint Genis, France

[21] Appl. No.: 435,642

[22] Filed: May 5, 1995

[30] Foreign Application Priority Data

May 9, 1994 [FR] France ............... 94 05925

[51] Int. Cl.[6] .............. H01L 29/74; H01L 31/111; H01L 23/62
[52] U.S. Cl. .............. 257/146; 257/120; 257/121; 257/123; 257/132; 257/157; 257/173; 257/175; 257/355
[58] Field of Search ............... 257/110, 120, 257/121, 123, 132, 140, 146, 157, 173, 175, 355; 361/56, 119, 91; 179/81

[56] References Cited

U.S. PATENT DOCUMENTS

| | | | |
|---|---|---|---|
| 4,456,940 | 6/1984 | Hammerberg et al. | 361/56 |
| 4,475,012 | 10/1984 | Coulmance | 179/81 |
| 4,695,916 | 9/1987 | Satoh et al. | 361/56 |
| 4,847,724 | 7/1989 | Renous | 361/91 |
| 4,849,846 | 7/1989 | Hung et al. | 361/56 |

FOREIGN PATENT DOCUMENTS 2 186 763  8/1987  United Kingdom ............ 361/56

OTHER PUBLICATIONS

French search report for French Patent Application Number 94/05925 filed May 9, 1994.

*Primary Examiner*—Steven H. Loke
*Attorney, Agent, or Firm*—Wolf, Greenfield & Sacks, P.C.; James H. Morris

[57] ABSTRACT

A protection device against overloads that may occur on an interface between a telephone exchange and line switches connected to a subscriber's line, comprises a single protection circuit on the subscriber side of the line switches with respect to the interface. The overvoltage protection circuit ensures an overvoltage protection when the line switches are off, and an overcurrent protection when the switches are on. A controlled switch, disposed between each conductor and ground, is switched on in response to the detection of an overvoltage or overcurrent.

10 Claims, 3 Drawing Sheets

OVERLOAD PROTECTION CIRCUIT

BACKGROUND OF THE INVENTION

1. Field of the Invention

The present invention relates to protection against overloads of telephone exchanges and more particularly to protection of an interface between telephone lines and telephone exchanges. Such an interface may, for example, include a board which receives eight telephone lines and is usually referred to as a Subscriber Line Interface Circuit (SLIC).

Although the present invention is described hereinafter with relation to this application, it should be understood that the invention is generally directed at providing a protection circuit against overvoltages and overcurrents that can be used for the protection of one or more conductors connected to various types of electrical or electronic devices.

2. Discussion of the Related Art

FIG. 1 represents a conventional SLIC connection. Between conductors T and R (Tip and Ring, respectively) of a subscriber telephone line and the SLIC, there are connected two respective resistors R1 and R2 and a line switching circuit 1 including relays controlled by coils or other detection and control circuits connected both to the line, and to the SLIC.

In the conventional connection, a protection device 2 is disposed between the switches 1 and the SLIC. The protection device 2 is designed to be turned on, i.e., to interconnect the conductors or to connect one of the conductors to ground as soon as the line voltage exceeds, by a predetermined value, the nominal line voltage, that is, approximately –48 volts for conductor R and a few negative volts for conductor T. The protection circuit is triggered, for example, when the voltage at conductor R is higher than 10 V and when the voltage at conductor T is lower than –60 V, as represented in FIG. 2A. Although FIG. 2A represents protection of the clipping-type, protection of the crowbar-type can be provided where, when the voltage is no longer within the range from –60 V to +10 V, the voltage is brought back to –48 V or 0 V.

Earlier devices used only protection device 2, because the switches 1 were electromechanical relays controlled by coils. Accordingly, when the switches were switched off, an overvoltage on the line could not cause any damage. The present trend is to replace the electromechanical relays with semiconductor systems whose control circuits cannot withstand high voltage differences on the line. Thus, additional protection devices 3 are commonly provided which trigger when the voltage on the line exceeds a predetermined threshold, for example, ±250 V. The protection devices 3 have, for example, a characteristic curve such as the one represented in FIG. 2B (which is of the crowbar-type). Of course, when the switches 1 are closed, the protection device 2 acts before the protection device 3 which is then unused.

This double protection system of a subscriber's interface exhibits two major drawbacks.

First, the cost of the protection is high due to the need for at least two protection components that have to be separately provided and mounted.

Second, if an overvoltage occurs while the line switches are closed, the protection device 2 will act but, during the overload, an important overcurrent may flow through these switches; this overcurrent may be destructive when the switches 1 themselves are of the semiconductor type.

SUMMARY OF THE INVENTION

Thus, a first, general object of the present invention is to provide a new method for protecting a subscriber's interface which avoids the above drawbacks and prevents overcurrents from occurring in the line switches during an overload occurring when the line switches are closed.

To achieve this object, the present invention provides, according to a first aspect of the invention, a method for protection against overloads that may occur on an electrical system interface such as at a telephone exchange having line switches connected to a subscriber's line, the method including disposing a single protection circuit on the subscriber side of the line switches with respect to the interface. This protection system ensures protection against overvoltages when the line switches are off, and protection against overcurrents when the line switches are on.

According to an embodiment of the invention, the method provides switching-on a controlled switch, disposed between each conductor and a reference, or between pairs of conductors, in response to the detection of an overvoltage or overcurrent.

Another general object of the invention is to provide a monolithic circuit for a single protection system providing protection against overvoltages occurring on one of the line conductors or against overcurrents flowing in the line.

A further object of the invention is to provide such a monolithic circuit which is particularly adapted for the protection of a subscriber's line interface circuit (SLIC).

To achieve these objects, there is provided, according to a second aspect of the present invention, a monolithic overload protection component for use on a line with which a detection resistor is disposed in series. For reference purposes, the terms upper surface and lower surface are used to describe parallel opposed surfaces. Other orientations are, of course, included, without loss of generality. This component has an upper surface and a lower surface and includes first and second upper metallizations to be connected to the terminals of the resistor, and a third lower metallization to be connected to ground. First and second thyristors are head-to-tail connected between the first and third metallizations, the second metallization corresponding to the gate of these thyristors. A first avalanche diode of a first polarity is formed between the first and third metallizations, and a second avalanche diode of a reverse polarity is formed between one of the first and second metallizations and the third metallization, these first and second diodes being disposed so that the switching-on of the diodes causes the triggering of one of the thyristors.

According to an embodiment of the invention, this component includes a substrate of a first conductivity type; a first region of a second conductivity type formed in the upper surface of the substrate; a second region of a second conductivity type formed in the lower surface of the substrate; a third region of the first conductivity type formed in substantially one half of the surface area of the first region; a fourth region of the first conductivity type formed in substantially one half of the surface area of the second region and substantially complementing the third region; a fifth region of the first conductivity type formed in a portion of the first region over a portion of the fourth region; a sixth high doped region of the first conductivity type at the interface of the first region with the substrate; a seventh high doped region of the first conductivity type at the interface of the second region with the substrate, and facing at least a portion of the fourth region; a first metallization coating the third region and most of the first region; a second metallization coating the fifth region and a portion of the first region near the third region; and a third metallization coating the second and fourth regions.

According to an embodiment of the invention, the fifth region is a narrow strip.

According to an embodiment of the invention, the third and fourth regions include emitter shorts; the density of the emitter shorting holes being higher in the third region than in the fourth region.

According to an embodiment of the invention, the first thyristor includes a gate current amplifying structure.

According to an embodiment of the invention, the component includes an eighth region of the second conductivity type formed in the first region, the eighth region including a ninth region of the first conductivity type, the second metallization coating the eighth and fifth regions, a fourth metallization connecting the ninth region to a portion of the first region adjacent to the third region.

According to an embodiment of the invention, the component includes in its upper surface an additional region of the second conductivity type intended to be connected to a failure detection circuit, this additional region being biased at a voltage higher than the voltage of all the other terminals of the component.

According to an advantageous aspect of the invention, the monolithic component includes a single main bidirectional protection element connected between each line conductor and ground. This main element is switched-on either by the occurrence of an overcurrent on the line or by the occurrence of overvoltages on at least one of the line conductors. Thus, the surface area of this monolithic component can be reduced since it does not include distinct protection element against overcurrents and overvoltages but has a single protection element triggered by triggering elements that are sensitive to overvoltages and overcurrents. Since these triggering elements need not conduct high currents, they do not require a large surface area.

The foregoing and other objects, features, aspects and advantages of the invention will become apparent from the following detailed description of the present invention when taken in conjunction with the accompanying drawings.

DETAILED DESCRIPTION

Figure 1:
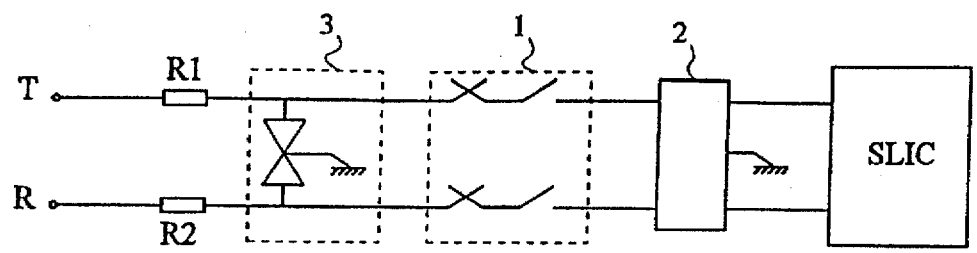
FIGS. 1, 2A and 2B, above described, illustrate an example of the encountered problem in the particular case of the protection of a SLIC.
Figure 2A:
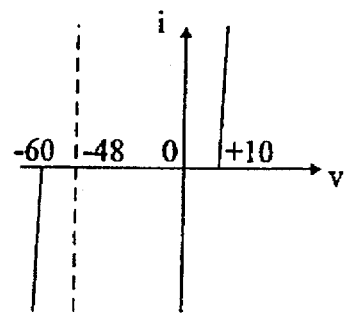
Figure 2B:
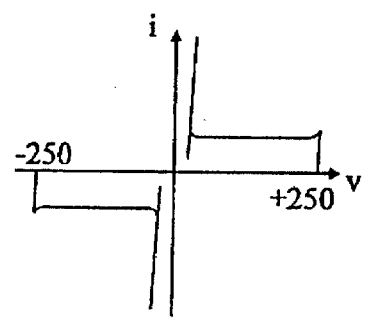
Figure 3:
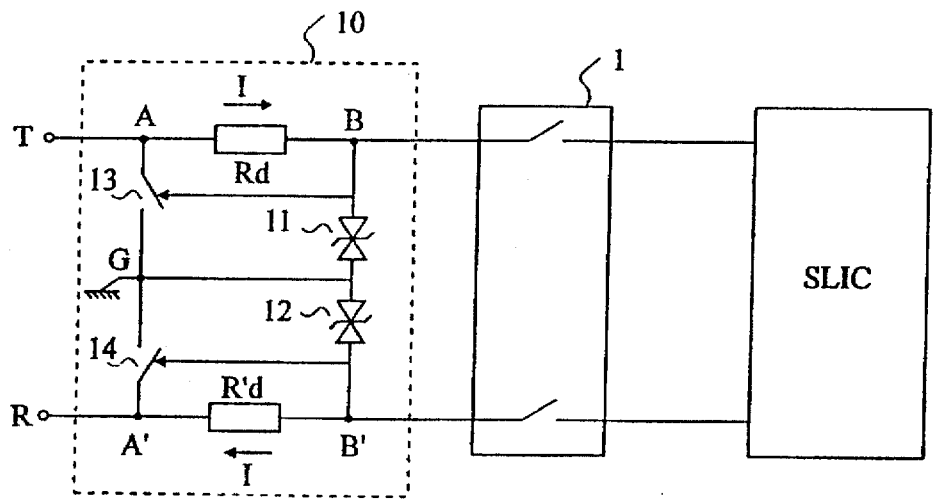
FIG. 3 represents a block diagram of the circuit for protecting the interface of a subscriber's line according to the present invention.

FIG. 3 represents a system according to the present invention and its connection for protection against overloads liable to occur on a subscriber's interface and line switches 1. A single protection device 10 provides both protection against overvoltages occurring when the line switches 1 are off (represented by way of example in FIG. 3 by double Shockley diodes 11 and 12) and protection against overcurrents occurring when the line switches 1 are on. This protection device includes four terminals, two of which are connected between terminals A and B which are disposed one on each side of a detection resistor Rd connected in series with the tip conductor T of the line. The other two terminals are connected between terminals A' and B' disposed one on each side of a detection resistor R'd connected in series with the ring conductor R. Overloads are drained off to a terminal G connected, for example, to ground. When an overcurrent is detected, switches 13 and 14, which are disposed between terminal A and terminal G and between terminals A' and terminal G, respectively, are switched on. According to an aspect of this device described hereinafter, the switching-on of either one of the protection devices 11 and 12 causes the immediate triggering of the corresponding switch 13 or 14. Thus, the present invention provides an overcurrent protection device which has the advantage of preventing the occurrence of overcurrents in line switches 1, even when the latter are closed.

Figure 4:
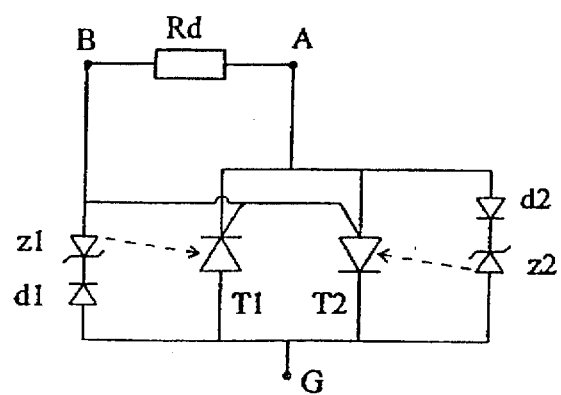
FIG. 4 represents a circuit embodying the present invention.

FIG. 4 represents an equivalent diagram of one half of a protection device according to the present invention. FIG. 4 represents only the elements existing between terminals A, B and G, the device being reproduced between terminals A', B' and G. Two head-to-tail connected thyristors T1 and T2, which are a cathode gate thyristor and an anode gate thyristor, respectively are disposed between terminals A and G. The gates are connected with terminal B. Thus, when a current flows through resistor Rd, a voltage difference occurs between each gate and the corresponding main electrode and causes the conduction of either one of those thyristors depending upon the direction of the current. The thyristor with the suitable polarity becomes conductive when the voltage at its gate is different from the voltage at the corresponding main electrode by a value of approximately 0.7 V. The resistance R of the resistor is then selected depending upon the value of current |I| at which it is desired that the protection device triggers so that |RI| is equal to approximately 0.7 V. Thus, for currents |I| ranging from 100 mA to 200 mA, resistor R has a value ranging from 6 to 3 ohms.

In addition, the present invention disposes respective avalanche diodes z1 and z2 between ground and each of terminals A and B. In a practical embodiment, as will be seen hereinafter, the avalanche diodes z1 and z2 are connected in series to diodes d1 and d2, respectively, of opposite polarity. Thus, for example, when a positive overvoltage occurs across terminals A and B, the avalanche diode z2 becomes conductive, and when a negative overvoltage occurs across terminals A and B, the avalanche diode z1 becomes conductive. According to an aspect of the present invention, the avalanche diodes z1 and z2 are designed with relation to thyristors T1 and T2 so that the triggering of the avalanche diode z1 causes thyristor T1 to become conductive, and the triggering of the avalanche diode z2 causes thyristor T2 to become conductive. Thus, the avalanche diodes z1 and z2 do not conduct high currents since the overloads are drained off by thyristors T1 and T2. Accordingly the avalanche diodes z1 and z2 can be small size diodes.

Figure 5:
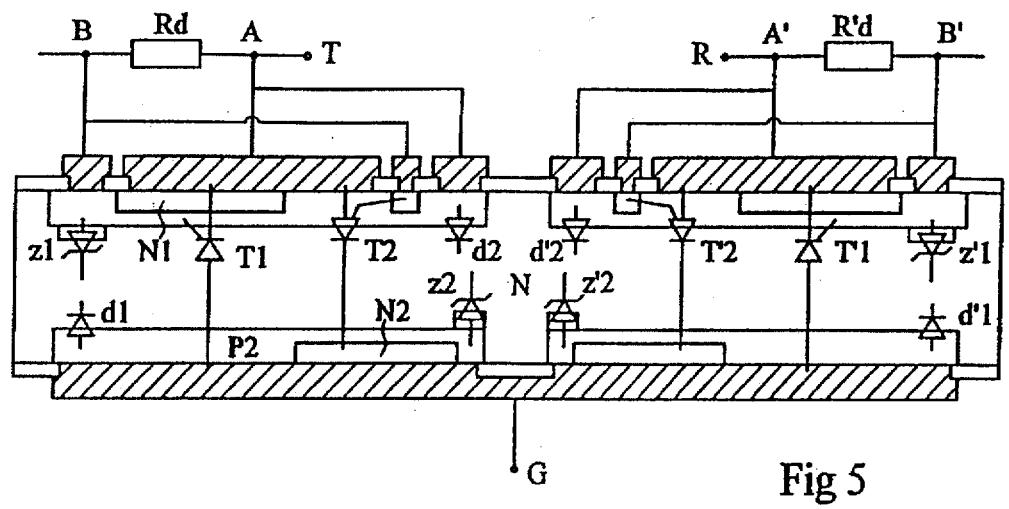
FIGS. 5, 6 and 7 are cross-sectional views (not to scale) illustrating various embodiments of a device according the present invention.
Figure 6:
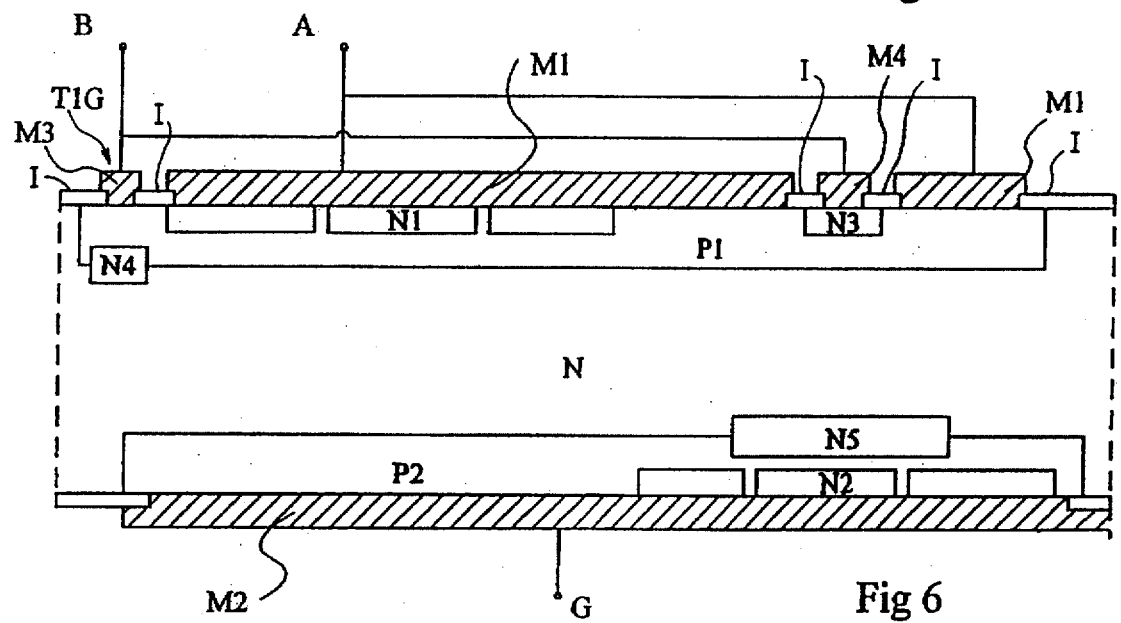

FIG. 5 schematically represents an embodiment of a component according to the present invention connected between terminals A, B, A', B' and G. In FIG. 5 are shown the approximate positions of the various equivalent semiconductor components corresponding to the circuit of FIG. 4. FIG. 6 represents the enlarged half part of FIG. 5. Hereinafter, both FIGS. 5 and 6 will be referred to.

As represented in FIG. 6, which illustrates the left half part of a component according to the present invention, such a component is formed from a substrate of a first conductivity type which is hereinafter considered as being of the N-type. In the upper and lower surfaces of this substrate are formed respective P-type regions, P1 and P2. An N-type region, N1, is formed in substantially one half of the surface area of region P1, and an N-type region, N2, is substantially complementary formed in substantially one half of the surface area of region P2. In addition, a distinct N-type region, N3, is formed in region P1 facing a portion of region N2 formed in the opposite surface. A highly doped N-type region, N4, is formed at the interface of region P1 with substrate N substantially beneath the gate contact region T1G of thyristor T1 formed by regions N1-P1-N-P2. A highly doped N-type region, N5, is formed at the interface of region P2 with substrate N over a portion of region N2. A metallization M1 coats most of the upper surface of regions N1 and P1. A metallization M2 coats most of the upper surface of regions P2 and N2 on the side of the lower surface of the component. A metallization M3 coats a small portion of region P1, near region N1 and over the above mentioned, region N4. A metallization M4 coats region N3. Metallization M1 is connected to terminal A, metallizations M3 and M4 are connected to terminal B, and metallization M2 is connected to terminal G.

Outside the regions where the metallizations contact semiconductor regions, the metallization are deposited over thin insulating regions I (conventionally, thin silicon oxide regions).

As represented in FIGS. 4 and 5, the portion of the component according to the present invention illustrated in FIG. 6 includes the following components:

a thyristor T1 formed by layers P2-N-P1-N1 having an anode connection that corresponds to metallization M2, a cathode connection that corresponds to metallization M1 and a gate connection that corresponds to metallization M3;

a thyristor T2 including layers P1-N-P2-N2 having an anode connection that corresponds to metallization M1, and a cathode connection that corresponds to metallization M2, that is, this thyristor is parallel, head-to-tail connected to thyristor T1, thyristor T2 also including in addition region N3 forming its anode gate, and metallization M4 forming a gate connection;

an avalanche diode z1 corresponding to the junction P1-N4, having an anode connection that corresponds to metallization M3 and a cathode connection that corresponds to metallization M2, avalanche diode z1 also being connected in series to a diode d1 corresponding to junction N-P2; and an avalanche diode z2 corresponding to the junction P2-N5, having an anode connection that corresponds to metallization M2, and a cathode connection that corresponds to metallization M1, avalanche diode z2 also being disposed in series with a diode d2 corresponding to junction P1-N.

Thus, the component of FIGS. 5 and 6 corresponds to the equivalent diagram illustrated in FIG. 4. In the right portion of FIG. 5 are shown elementary components T'1, T'2, z'1, z'2, d'2 that are symmetrical to the above-described components and connected to terminals A' B' and G.

The operation of the circuit is as follows:

When the line switches 1 are off and a negative overvoltage, with respect to ground, occurs at terminals A and B, the avalanche diode z1 avalanches and carriers are generated near junction P1-N. Accordingly, thyristor T1 becomes conductive, and the overvoltage is clamped to ground by thyristor T1.

When the line switches 1 are off and a positive overvoltage, with respect to ground, occurs at terminals A and B, the avalanche diode z2 avalanches. This avalanching causes the generation of carriers in the vicinity of junction N-P2 of thyristor T2 and thyristor T2 becomes conductive.

When the line switches 1 are on and a negative overcurrent occurs on the line, a positive voltage appears across terminals B and A. When this voltage reaches approximately 0.7 V, a gate current flows through junction P1-N1 and the cathode gate thyristor T1 triggers.

When the line switches 1 are on and a positive overcurrent occurs on the line, a positive current flows from terminal A to terminal B, and a positive voltage appears across terminals A and B. Thus, junction P1-N3 is forward biased and, as soon as the forward conduction threshold of diode P1-N3 (approximately 0.7 V) is reached, the current flowing through junction P1-N3 causes the generation of carriers also near junction P1-N, which causes thyristor T2 (P1-N-P2-N2) to be triggered.

The general operation of a component according to the present invention has been disclosed above. In addition, the component must comply with various sensitivity and symmetry characteristics in order to properly fulfil its required function.

The triggering of thyristor T1 or T2 through the avalanche diode z1 or z2 does not raise any particular problem. It is sufficient to select the doping level of regions N4 and N5 to obtain the desired avalanche voltage, for example 250 V. In addition, in case an overload occurs when the line switches are off, at the end of the overload, there is no voltage on the line and the thyristor T1 or T2 which had become conductive naturally turn off.

The problem is more complex when triggering is caused by an overcurrent. Indeed, the device should comply with three constraints.

The first constraint is that the thyristors should trigger for a predetermined current flow in resistor R, for example a current of approximately 200 mA. To achieve this result, the gate current liable to set the thyristors in conduction should be low with respect to the current in resistor Rd, for example approximately 20 mA. As a result, thyristors T1 and T2 should be relatively sensitive.

The second constraint is that the device should be as symmetrical as possible. That is, it should trigger at substantially the same positive and negative overcurrent thresholds.

The third constraint occurs in particular when the device is designed to protect a telephone line. Then, when the line switches are on, a voltage of approximately −48 V occurs permanently on the ring terminal (R) with respect to terminal G. Accordingly, the thyristor (T1 or T'1) whose anode corresponds to terminal G and whose cathode corresponds to the ring terminal must be able to turn off again when a 48-V voltage is present across these terminals. This does not raise any major problem for the thyristor T1 or T'1 because resistor Rd is connected in series with this thyristor and the constraint on the hold current of the thyristor is in practice moderate. However, it can be noticed, referring to FIG. 6, that, in addition, there is a spurious thyristor (junction P2-N-P1-N3) whose anode corresponds to terminal G and cathode to terminal B. Terminal B is directly connected to voltage −48 V. Accordingly, this spurious thyristor should have a high hold current so as to not remain conductive at the end of an overload.

It will be explained hereinafter that these three constraints can be overcome by selecting the surface areas for the various layers, the disposition of the gate regions, and the density of emitter shorting holes formed through regions N1 and N2.

Figure 7:
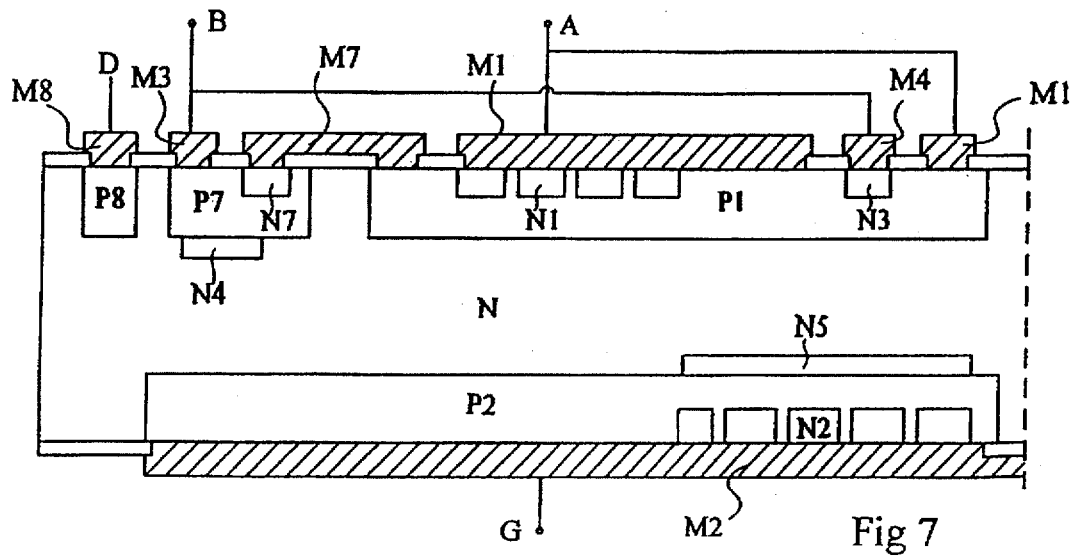

FIG. 7 is a cross-sectional view of an alternative half component according to the present invention in which thyristor T1 comprises a gate current amplifying structure and in which a failure detection circuit are added to the device of FIG. 6.

The right portion of FIG. 7 is identical to FIG. 6 and the same layers and regions are designated with the same references.

A P-type region, P7, is formed from the upper surface of substrate N near the gate region of thyristor T1. An N-type region, N7, is formed in region P7. Region N4, instead of being formed beneath a portion of region P1, is formed beneath region P7. Metallization M3, instead of being disposed over a portion of region P1, is disposed over an upper surface of region P7, and a metallization M7 connects a portion of the upper surface of region N7 to a portion of the upper surface of region P1. Metallization M7 is not connected to any external terminal. Metallization M3 is connected to terminal B. Thus, a thyristor T1 with a gate amplification, and therefore an increased sensitivity, is formed. The avalanche diode z1 now corresponds to junction P7-N4 and, as previously, its conduction causes the triggering of thyristor T1.

In addition, the present invention associates a failure indicator with the above described component. For this purpose, an additional region P8 is formed in the upper surface of substrate 1 and is integral with a metallization M8 connected to a terminal D. Terminal D is connected to a failure indicator and to a voltage supply higher than the voltage supply of each of the terminals A, B, and G. Thus, during normal operation, a blocking junction (junctions N-P1, N-P7, and N-P2) is provided between terminal D and each of terminals A, B, and G. In contrast, if, in response to a too high overload, the component according to the present invention is shorted, one of the junctions N-P1, N-P7, or N-P2 is destroyed and corresponds to a shorting. Thus, a current can flow between terminal D and one of terminals A, B and G. This current is detected by a failure indicator. The failure indicator can be associated with a local or remote, display or alarm system.

Figure 8A:
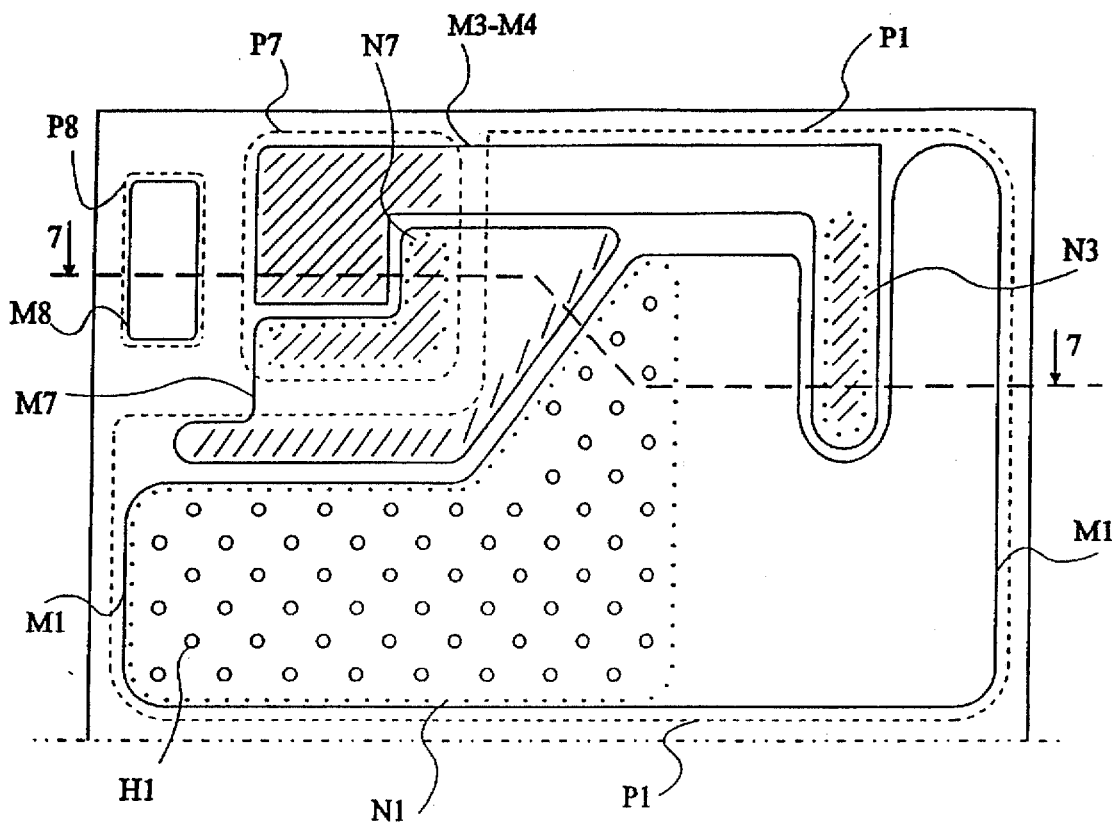
FIGS. 8A and 8B represent a top view and a bottom view, respectively, of an embodiment of the component of FIG. 7.
Figure 8B:
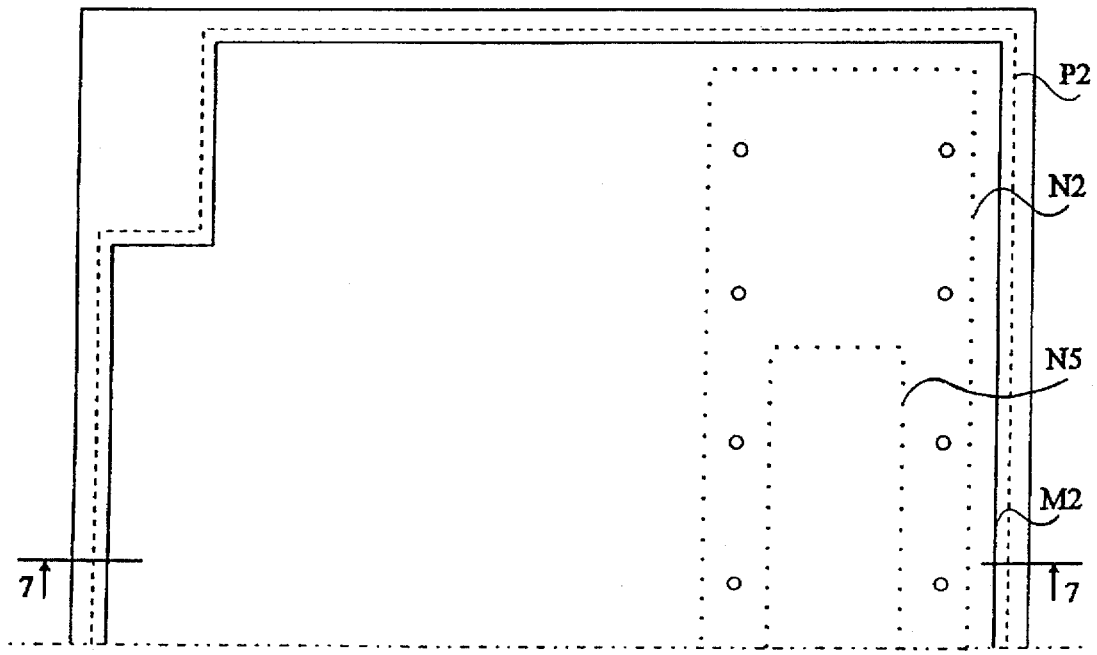

FIGS. 8A and 8B are a top view and an upside-down bottom view, respectively, of the component illustrated in FIG. 7, which is a cross-sectional view along line 7—7 shown in FIGS. 8A and 8B. In these figures, the outlines of the metallizations are drawn in solid lines, the outlines of regions P are drawn in dashed lines, and the outlines of regions N are drawn in dotted lines.

Thus, FIG. 8A shows metallizations M1, M3–M4 (a single metallization), M7 and M8, P-type regions P1, P7 and P8, and N-type regions N1, N3 and N7. Region N4, not shown, extends substantially beneath region P7. The interface of region N7 with a portion used as a gate of region P1 is drawn in hatched lines beneath metallization M7. The remaining portion of metallization N7 is formed over an insulator (an oxide). Similarly, the contact of metallization M3–M4 with region N3 and with a portion of region P7 where is not formed region N7 is drawn in hatched lines. FIG. 8A is only an exemplary embodiment of a structure according to the present invention. The following characteristics will be noted:

region P1 occupies most of the component surface area;
region N1 occupies substantially one half of the surface area of region P1;
the density of the emitter shorting holes H1 formed in region N1 is relatively high so that thyristor T1 has a relatively high hold current, a highly sensitive thyristor being obtained through the gate current amplifying structure;

region N3 is constituted by an elongated narrow strip so that the spurious thyristor P2-N-P1-N3 has a high hold current. Strip N3 has, for example, a width of approximately 120 μm;

region N7 constituting the emitter of the pilot thyristor does not includes any shorting hole to obtain a high sensitivity.

The bottom view 8B shows metallization M2, the P-type region P2, the N-type region N2, and the N-type region N5 which is formed at the interface between region P2 and the N region. In FIG. 8B, it should be noticed that:

region P2 does not extend beneath region P8 (however, this is not mandatory);

region N2 includes a very small density of emitter shorting holes. This is intended to obtain a relatively highly sensitive anode gate thyristor T2. Of course, this results in thyristor T2 having a low hold current. But this is not an impairment because, as indicated above, this thyristor has a substantially zero voltage across its terminals at the end of an overload.

As is apparent to those skilled in the art, various modifications can be made to the above disclosed preferred embodiments, more particularly for the disposition of the various layers illustrated only as an exemplary embodiment in FIGS. 8A and 8B.

Although the conductivity polarities of all the layers can be inverted, the circuit in which the substrate is of the N-type is preferred in order to properly ensure the above-described compromise between sensitivity and hold current.

In addition, although in the present disclosure "ground" designates the terminal with a fixed voltage to which overloads are drained off, it should be noted that this "ground" can be different from the ground of the circuit to be protected and from the reference voltage of the line.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A monolithic protection component against overloads that occur on a conductor with which a detection resistor is disposed in series, said component having an upper surface and a lower surface, and including:

first and second metallizations adapted to be connected to the terminals of said resistor, and a third metallization adapted to be connected to ground;

first and second thyristors, connected in parallel between the first and third metallizations, with the anode of the first thyristor and the cathode of the second thyristor connected together and with the cathode of the first thyristor and the anode of the second thyristor connected together, the second metallization forming connections to gates of said thyristors; and a first avalanche diode disposed in proximity with the first thyristor and the first avalanche diode being at least one element of a first circuit branch connected between the second and third metallizations, and a second avalanche diode disposed in proximity with the second thyristor and the second avalanche diode being at least one element of a second circuit branch connected between the first and third metallizations, the first diode being oriented to avalanche upon application of a voltage to the second metallization relative to the third metallization of one polarity and the second diode being oriented to avalanche upon application of a voltage to the first metallization relative to the third metallization of another polarity, said first and second diodes being disposed so that the conduction of one of the diodes causes the switching-on of a corresponding one of the thyristors by generating excess carriers in proximity with the corresponding one of the thyristors, thereby triggering the corresponding one of the thyristors.

2. The monolithic protection circuit of claim 1, including:

a substrate of a first conductivity type;

a first region of a second conductivity type formed in the upper surface of the substrate;

a second region of the second conductivity type formed in the lower surface of the substrate;

a third region of the first conductivity type formed in substantially one half of the surface area of the first region, the third region not occupying a portion of the first region;

a fourth region of the first conductivity type formed in substantially one half of the surface area of the second region and substantially underlying the portion of the first region not occupied by the third region;

a fifth region of the first conductivity type formed in said portion of the first region over a portion of the fourth region;

a sixth highly doped region of the first conductivity type formed at the interface of the first region with the substrate; and a seventh highly doped region of the first conductivity type formed at the interface of the second region with the substrate facing at least a portion of the fourth region; wherein the first metallization disposed on the upper surface and coveting the third region and a portion of the first region;

the second metallization disposed on the upper surface and covering the fifth region; and the third metallization disposed on the lower surface and covering the second and fourth regions.

3. The protection circuit of claim 2, wherein the fifth region is a narrow strip.

4. The protection circuit of claim 2, wherein the third and fourth regions include emitter shorting holes and wherein the density of the emitter shorting holes is higher in the third region than in the fourth region.

5. The protection circuit of claim 2, further including:

a subsection of the first region at which the sixth region is formed being separated from the first region by a portion of the substrate; and including an eighty region of the first conductivity type formed in the subsection of the first region;

the second metallization disposed on the upper surface and coveting the subsection of the first region and covering the fifth region; and a fourth metallization connecting the eighth region to the first region at a location adjacent to the third region.

6. The protection circuit of claim 2, including in its upper surface an additional region of the second conductivity type adapted to be connected to a failure detection circuit, said additional region being biased at a voltage higher than a voltage present at any other terminal of the component.

7. The protection circuit of claim 1, wherein the first thyristor includes a gate current amplifying structure.

8. A monolithic protection component against overloads of either of two polarities relative to ground that occur on a conductor with which a detection resistor having two terminals is disposed in series, said component having an upper surface and a lower surface, and including:

first and second metallizations adapted to be connected respectively to the two terminals of said resistor, and a third metallization adapted to be connected to ground;

a switched, main protection element connected between the first metallization and the third metallization, the element including a device which is switchable by a trigger signal from a substantially non-conductive state to a conductive state; and a triggering element including a first device connected between the first metallization and the third metallization and a second device connected between the second metallization and the third metallization, the triggering element responsive to the overloads to produce the trigger signal.

9. The component of claim 8, wherein the switched, main protection element includes an input, connected to the second metallization to switch the switched, main protection element from the substantially non-conductive state to the conductive state when a current overload in the resistor occurs.

10. The component of claim 8, further comprising:

a failure indicator having a plurality of states of conduction, which is responsive to the state of the switched, main protection element, the failure indicator changing state when the switched, main protection element changes state.

* * * * *